United States Patent [19]
Adan

[11] Patent Number: 5,606,189
[45] Date of Patent: Feb. 25, 1997

[54] DYNAMIC RAM TRENCH CAPACITOR DEVICE WITH CONTACT STRAP

[75] Inventor: Alberto O. Adan, Tenri, Japan

[73] Assignee: Sharp Kabushiki Kaisha, Osaka, Japan

[21] Appl. No.: 111,967

[22] Filed: Aug. 26, 1993

Related U.S. Application Data

[63] Continuation of Ser. No. 786,831, Nov. 1, 1991, abandoned.

[30] Foreign Application Priority Data

Mar. 13, 1991 [JP] Japan .................................... 3-048142

[51] Int. Cl.⁶ ........................................................ H01L 29/78
[52] U.S. Cl. .......................... 257/303; 257/301; 257/297; 257/306
[58] Field of Search ................................. 257/303, 301, 257/297, 306

[56] References Cited

U.S. PATENT DOCUMENTS

| | | | |
|---|---|---|---|
| 4,958,318 | 9/1990 | Harari | 365/149 |
| 5,012,308 | 4/1991 | Hieda | 357/23.6 |

FOREIGN PATENT DOCUMENTS

| | | | |
|---|---|---|---|
| 62-131563 | 6/1987 | Japan | 357/23.6 |
| 1-18253 | 1/1989 | Japan . | |
| 1-218056 | 8/1989 | Japan . | |
| 64-339799 | 12/1989 | Japan . | |
| 2-3274 | 1/1990 | Japan . | |
| 02297962 | 12/1990 | Japan . | |

OTHER PUBLICATIONS

IBM Technical Disclosure Bulletin, vol. 31, No. 7, Dec. 1988 pp. 409–417.

IBM Technical Disclosure Bulletin, vol. 23, No. 4, Sep. 1980, pp. 1447–1448.

*Primary Examiner*—Jerome Jackson
*Attorney, Agent, or Firm*—Nixon & Vanderhye P.C.

[57] ABSTRACT

A FEC-DRAM of 3 elements/2 bits type having a stack capacitor of increased capacitance to ensure integration with an increased density. The stack capacitor is formed as embedded in a trench, and local wiring is provided to form an electric contact on an element isolation region. When required, the stack capacitor is made to extend onto a word line region. The stack capacitor is given an increased surface area and a greater capacitance, consequently reducing the area occupied and making it possible to provide DRAMs with a higher packing density.

6 Claims, 10 Drawing Sheets

DYNAMIC RAM TRENCH CAPACITOR DEVICE WITH CONTACT STRAP

This is a continuation of application Ser. No. 07/786,831, filed Nov. 1, 1991, now abandoned.

BACKGROUND OF THE INVENTION

1. Field of the Invention

The present invention relates to dynamic RAMs (DRAMs) and a process for producting the same, and more particularly to a floating electrode capacitor DRAM and a process for producing the same.

2. Description of the Related Art

DRAM cells are already in wide use which comprise one MOS transistor and one capacitor as shown in FIG. 22. To meet a demand for higher packing densities and reduced cell sizes, a floating electrode capacitor DRAM (FEC-DRAM) cell has recently been proposed (U.S. patent application Ser. No. 07/455,989 filed Dec. 22, 1989 and entitled "Dynamic Semiconductor Memory Device," and Japanese Patent Applications Nos. 63-330970and 1-68880) which comprises two MOS transistors and one capacitor as seen in FIG. 23.

The FEC-DRAM cell, which is of three-element structure, is capable of storing 2 bits of data in one capacitor and therefore has a greater storage capacity per element (1.5 elements/bit) than the conventional cell of the 2 elements/bit type.

However, the conventional FEC-DRAM cell has a stack capacitor wherein a floating capacitor C is provided between an upper electrode UP and a lower electrode LP which have respective contacts for electric connection to the Source/Drain active regions A, B of the pair of MOS transistors Q1, Q2, so that the contacts and the floating capacitor require an area on the substrate.

Accordingly, the FEC-DRAM cell occupies a relatively large area over the substrate and is not always advantageous in ensuring a higher packing density. For example, if the cell is adapted to occupy approximately the same area as cells of the 1 element/bit type, the cell has the disadvantage of being insufficient in capacitance. The cell further has the problem of necessitating a complex process when the stack capacitor is to be formed on the substrate with minimized misalignment.

SUMMARY OF THE INVENTION

The main object of the present invention, which has been accomplished in view of the above situation is to provide a FEC-DRAM which occupies a small area on the substrate and which nevertheless has a great capacitance, and a process for producing the same.

Accordingly, the present invention provides. a dynamic RAM comprising (a) a pair of MOS transistors formed side by side on a substrate, (b) a trench formed in the substrate between Source/Drain active regions A and B adjacent to each other at one end of each of the MOS transistors, and (c) a stack capacitor comprising a first electrode layer connected to the impurity region A, capacitor insulating layer and a second electrode layer connected to the impurity region B the layers being formed one over another and embedded in the trench in the order mentioned.

The present invention further provides a process for producing a dynamic RAM comprising the steps of (a) forming a trench in a substrate between impurity regions A and B adjacent to each other at one end of each of a pair of MOS transistors provided side by side on the substrate, (b) forming a contact strap on one of the impurity regions, B, (c) forming a first electrode layer on the other impurity region A and over the inner surface of the trench, as insulated from the contact strap, (d) forming a capacitor insulating layer over the first electrode layer, and (e) forming on the capacitor insulating layer a second electrode layer to be connected to the contact strap.

BRIEF DESCRIPTION OF THE DRAWINGS

FIGS. 6(a) and 6(b) to FIGS. 16(a) and 16(b) are diagrams illustrating the production process of the invention stepwise and subsequent to FIG. 5;

DESCRIPTION OF THE PREFERRED EMBODIMENTS

The dynamic RAM of the present invention comprises two MOS transistors and one stack capacitor connected therebetween. Since the stack capacitor is embedded in a trench formed between the adjacent ends of the transistors so as to extend along the trench inner wall, the DRAM can be given a sufficient capacitance. The trench can be formed between the word lines in the DRAM layout as self-registered with the lines without misalignment. This assures DRAM cells of a great capacitance with improved reproducibility. Furthermore, the stack layer can be easily made to extend, as centered at the stack capacitor within the trench, onto the word lines adjacent thereto. This permits a further increase in capacitance.

EXAMPLES

The FEC-DRAM of the present invention will be described below with reference to the accompanying drawings.

Figure 1:
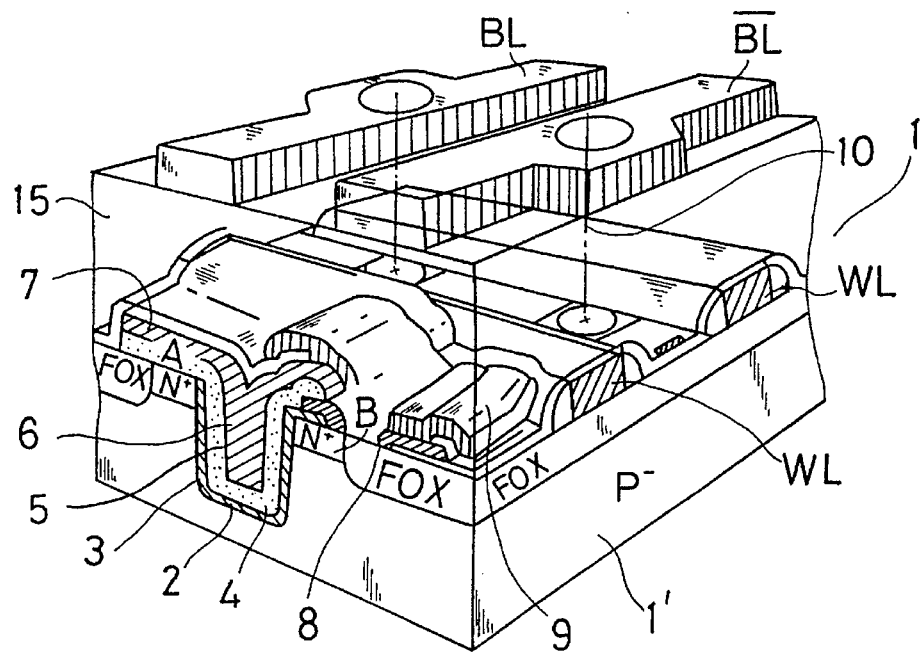
FIG. 1 is a perspective view partly in section and showing a FEC-DRAM cell embodying the present invention.
Figure 2:
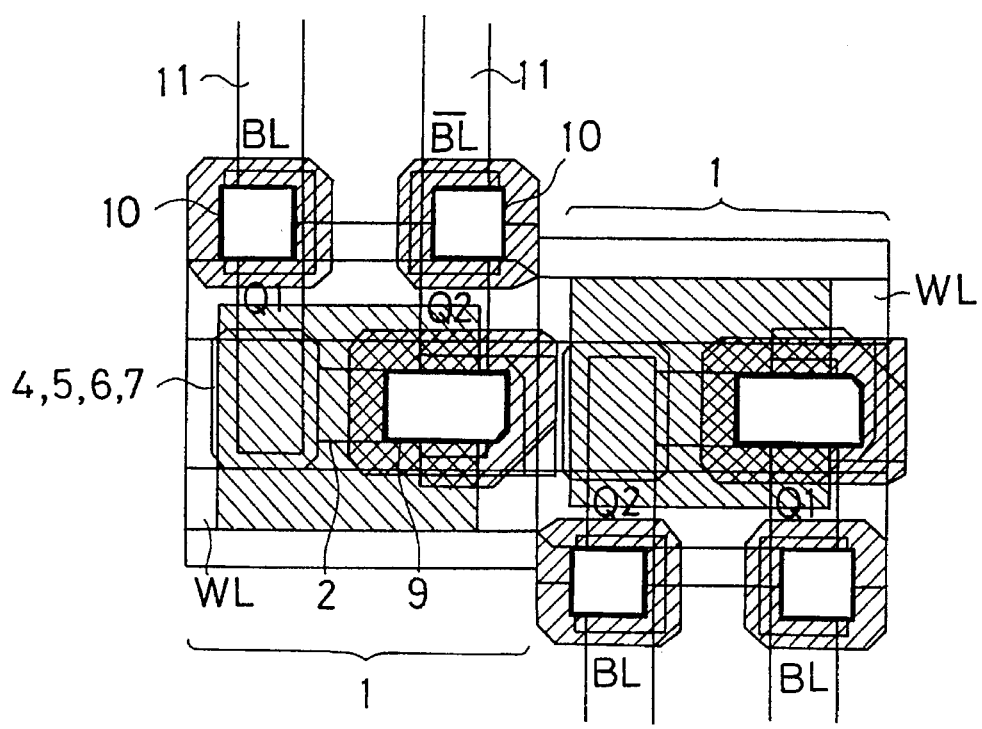
FIG. 2 is a layout diagram corresponding to FIG. 1.

FIG. 1 is a perspective view partly in section and showing a FEC-DRAM cell embodying the invention. FIG. 2 is a layout diagram corresponding to FIG. 1 and showing two FEC-DRAM cells arranged as a group.

As seen in the drawings, the FEC-DRAM cell 1 of the invention comprises a pair of MOS transistors Q1, Q2 fabricated by forming on the p-type silicon substrate 1' active regions 11, bit lines BL and $\overline{BL}$, and word lines WL as arranged in a matrix. The Opposed $N^+$ impurity regions at one side of the pair of transistors Q1, Q2 are connected to the bit line BL and $\overline{BL}$, respectively, through contact holes 10.

A trench 2 is formed in the substrate between the adjacent $N^+$ impurity regions A, B at the other side shown. The trench is used for forming a capacitor between the impurity regions A, B.

Figure 23:
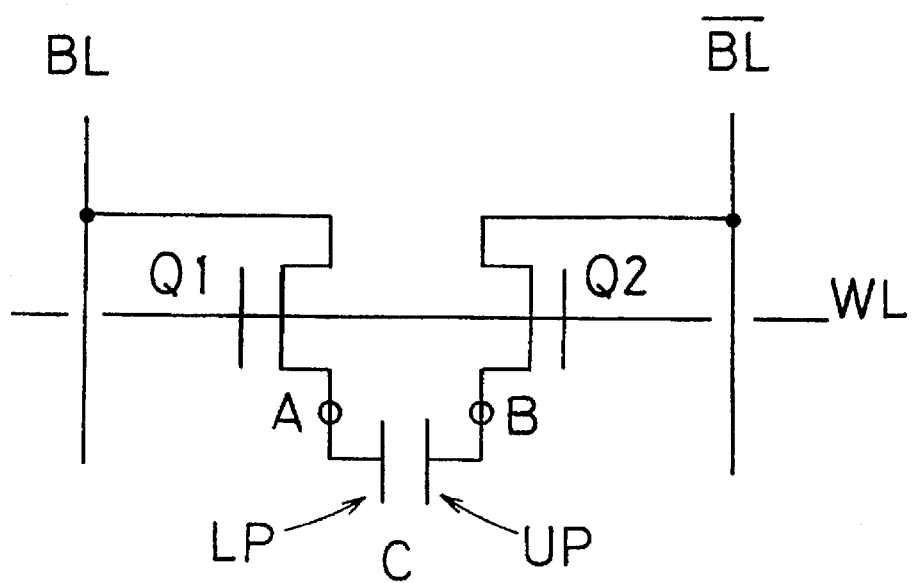
FIG. 23 is an equivalent circuit diagram of a DRAM cell of the 3 elements/2 bits type.

The capacitor comprises a first electrode layer 4 of polysilicon, capacitor insulating layer 5 of $SiO_2/SiN$ and a second electrode layer 6 of polysilicon which are formed one over another in this order over the inner surface of the trench 2 coated with an SiN insulating film 3 and which are thus embedded in the trench. The first electrode layer 4 has a specified area to extend through the trench opening end over the impurity region A in direct contact therewith and to extend over the word lines WL to the central portion of each line. On the other hand, the second electrode layer 6 is so formed as to cover the entire area of the first electrode layer 4 with the capacitor insulating layer 5 interposed therebetween and to contact through an upper silicon electrode 9 with a contact strap 8 (polysilicon) formed, as insulated from the first electrode layer, on the impurity region B. Thus, a stack capacitor of a specified square form including the interior of the trench and also partly including the word line regions is formed across the impurity regions A, B to provide circuit. The FEC-DRAM realized is of the three-element two-bit storage type as shown in FIG. 23.

In FIG. 1, indicated by FOX is a field oxide film, at 7 a surface protecting layer ($SiO_2$) for the capacitor, and at 15 an interlayer insulating film.

The FEC-DRAM can be produced, for example, by the process shown in FIGS. 3 to 17 as will be described in detail below.

Figure 3:
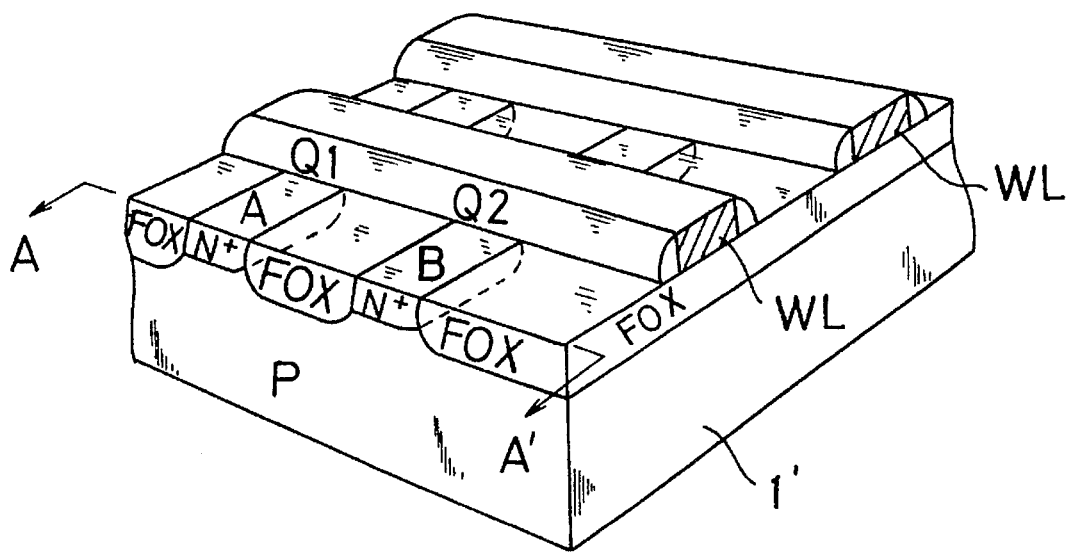
FIG. 3 is a perspective view showing the cell in the course of production process.
Figure 4:
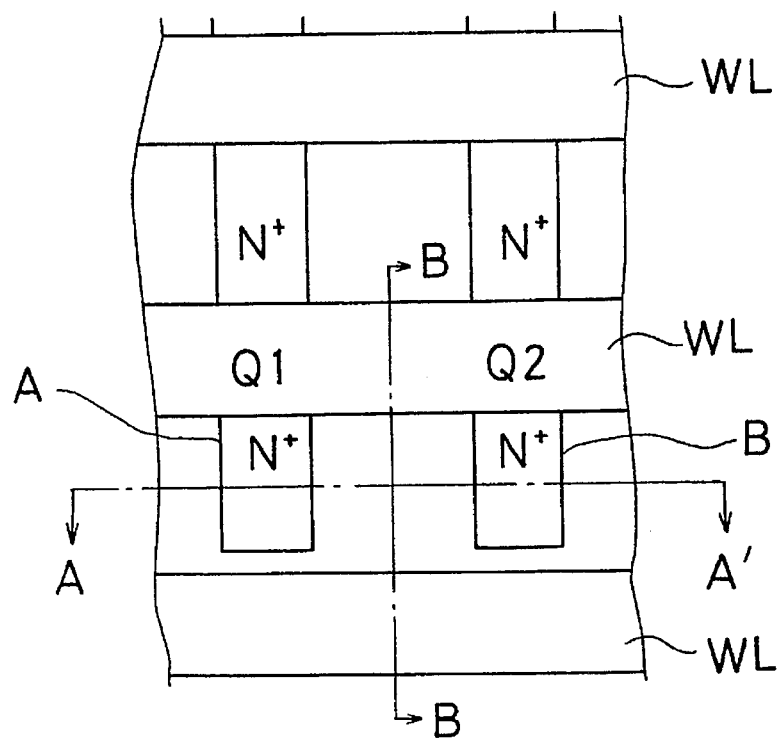
FIG. 4 is a plan view corresponding to FIG. 3.
Figure 5A:
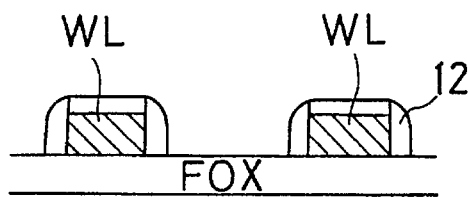
FIGS. 5(a) and 5(b) include a view (a) in section taken along the line B–B' in FIG. 4, and a view (b) in section taken along the line A–A' in FIG. 4.
Figure 5B:
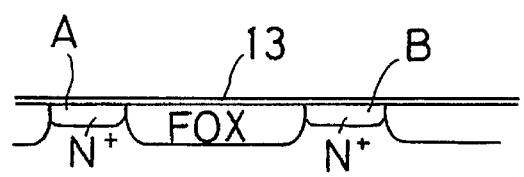
Figure 6A:
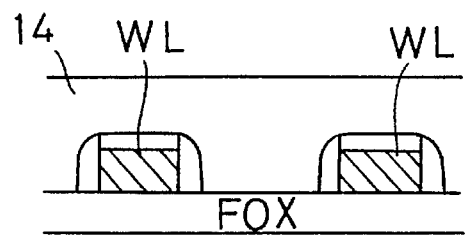
Figure 6B:
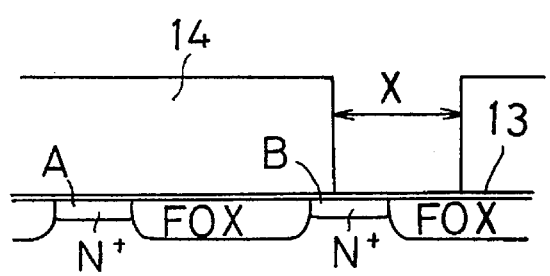

With reference to FIG. 3, first formed on a silicon substrate 1' is an active region including $N^+$ impurity regions A, B patterned by a field oxide film. Word lines WL (about 0.5 μm in width) are then formed on the active region to provide MOS transistors Q1, Q2. In this example, the impurity regions A, B correspond to the drains of the respective transistors. FIG. 4 is a plan view showing this state. FIG. 5, (a) is a view in section taken along the line B–B' in FIG. 4, and FIG. 5, (b) is a view in section taken along the line A–A' in FIG. 4. Indicated at 12 in FIG. 5 is the side wall ($SiO_2$) of the word line WL serving as a gate, and at 13 an oxide surface film which is a thermal oxide film.

Figure 7A:
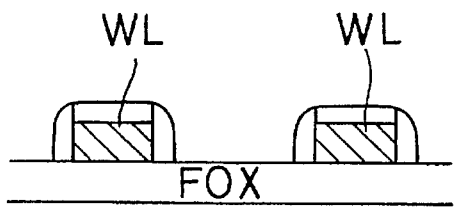
Figure 7B:
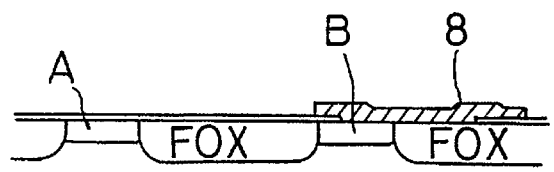

The formation of the word lines is followed by coating with a resist 14, and a major portion of the oxide film 13 on the impurity region B is removed (width X: about 1 μm). As shown in FIG. 7, a contact strap 8 (about 1000 angstroms in thickness, about 1 ×about 1 μm) of polysilicon is then formed to cover the removed portion.

Figure 8A:
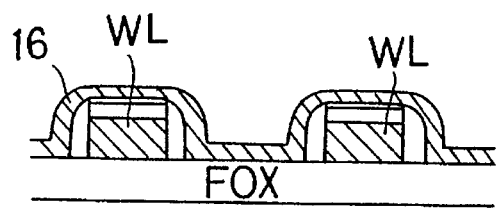
Figure 8B:
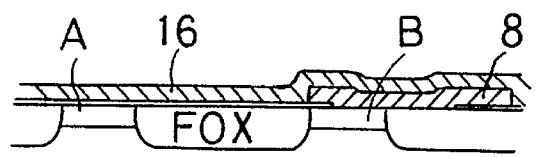
Figure 9A:
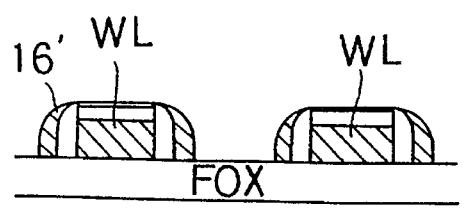
Figure 9B:
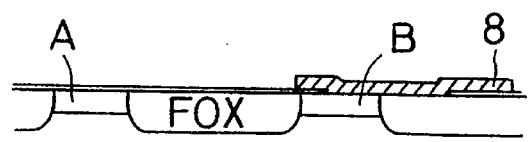
Figure 10A:
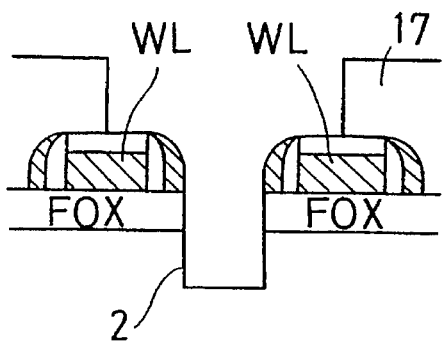
Figure 10B:
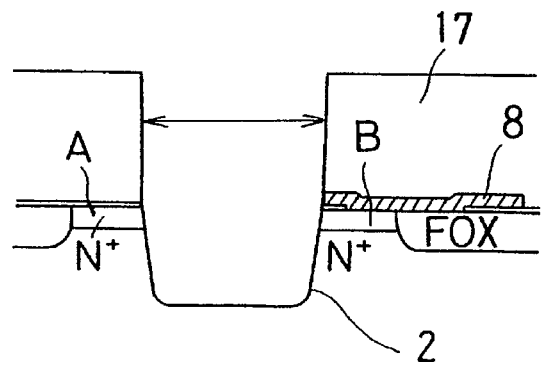

Next as shown in FIGS. 8 and 9, an SiN layer 16 is formed by LPCVD, and the layer is etched back to form a side wall 16' for protecting the side portions of the word lines WL. A rectangular trench 2 is then formed in the substrate between the impurity regions A, B and between the word lines WL,WL by anisopropic etching using a resist 17 as shown in FIG. 10. In view of the capacitance, it is suitable that the trench be usually 0.5 to 1 μm in width and about 2 to about 5 Bm in depth although the width and depth are dependent on the cell size.

Figure 11A:
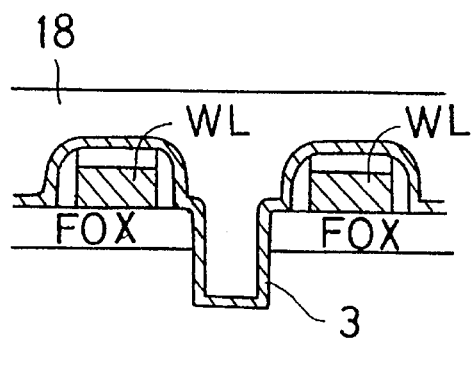
Figure 11B:
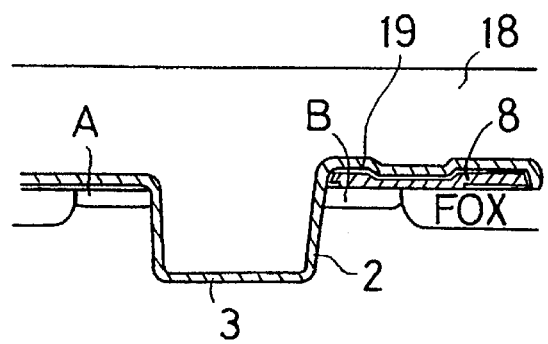

After the trench has been formed, the resist 17 is removed, and the resulting surface is subjected to thermal oxidation to thereby form an insulating oxide film 19 primarily over the contact strap. SiN is thereafter deposited on the entire surface by LPCVD to form an SiN insulating film 3 (about 1000 anstroms in thickness) over the inner surface of the trench as shown in FIG. 11. Subsequently, a masking SOG layer (or resist layer) 18 is formed over the entire surface.

Figure 12A:
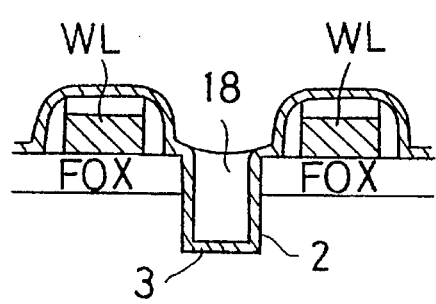
Figure 12B:
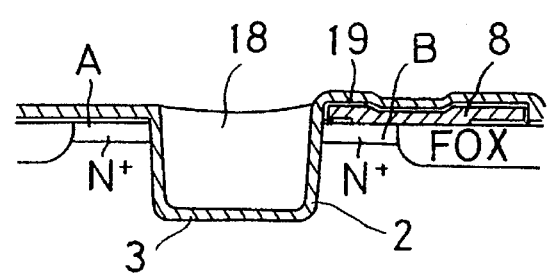
Figure 13A:
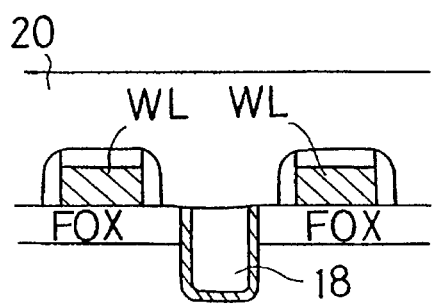
Figure 13B:
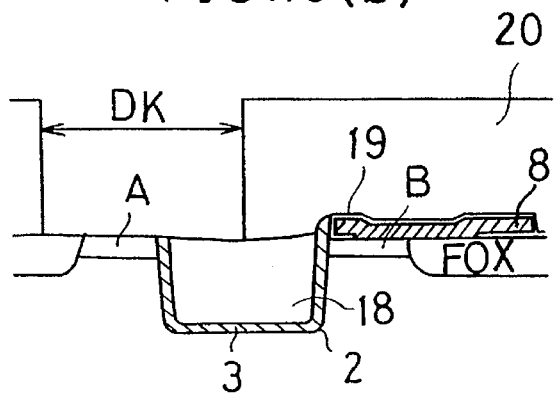

Next as seen in FIG. 12, the SOG layer (or resist layer) 18 is etched back to the level of the trench opening to expose the SiN insulating film 3 except the film portion inside the trench. The exposed portion of the SiN insulating film is removed by isotropic etching, and the SiN insulating film 3 and the oxide surface film 13 are then removed from the impurity region A and the surrounding portion thereof using a resist 20 as seen in FIG. 13 to provide a contact portion for the impurity region A.

Figure 14A:
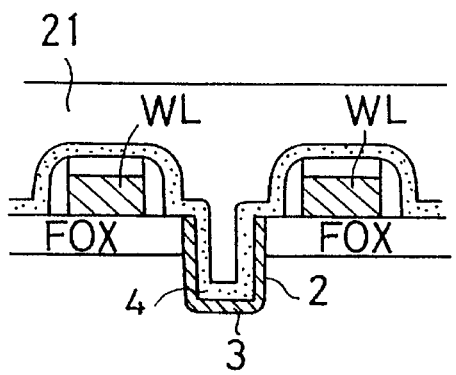
Figure 14B:
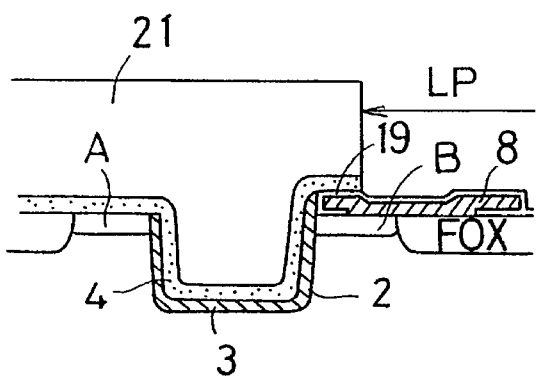
Figure 15A:
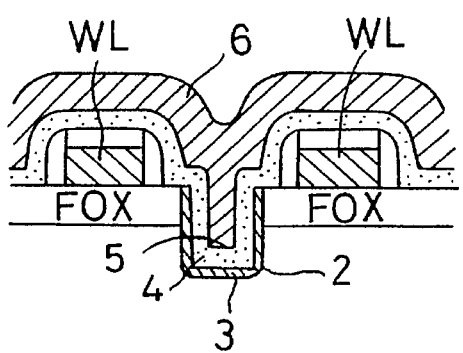
Figure 15B:
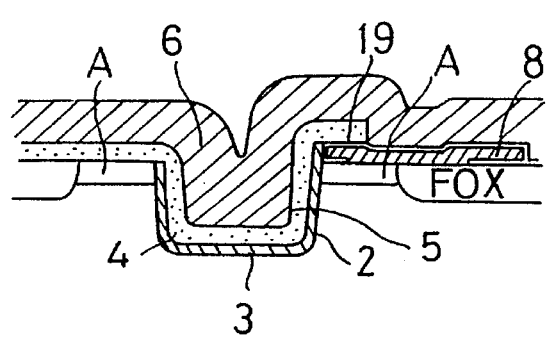

A first electrode layer 4 (about 0.1 μm in thickness) of polysilicon is thereafter formed over the entire surface. The first electrode layer is removed from the surface of the contact strap 8 except the end thereof adjacent to the trench using a resist 21 as shown in FIG. 14. Over the first electrode layer 4 is then formed a capacitor insulating layer 5 (about 100 angstroms in thickness) of $SiO_2$ or $N_4$, followed by the deposition of a second electrode layer 6 (about 0.1 μm in thickness) of polysilicon on the entire surface. In this state, the impurity region A is in contact with the first electrode layer 4, but the impurity region B is held out of contact with the second electrode layer 6 by the presence of the oxide film 19.

Figure 16A:
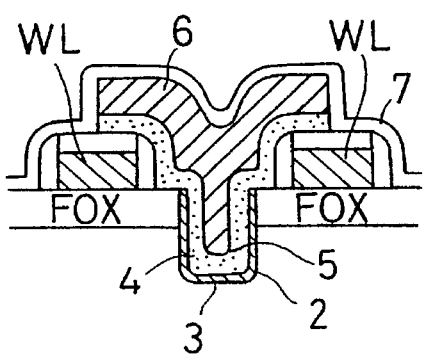
Figure 16B:
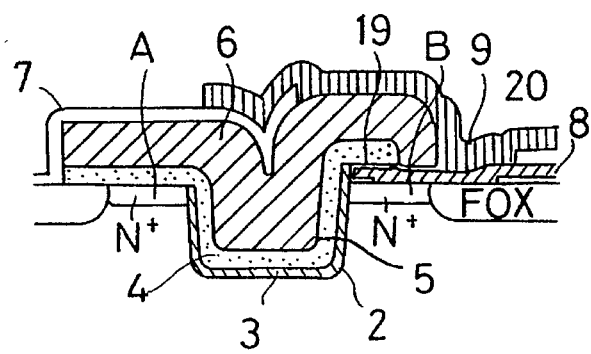
Figure 17:
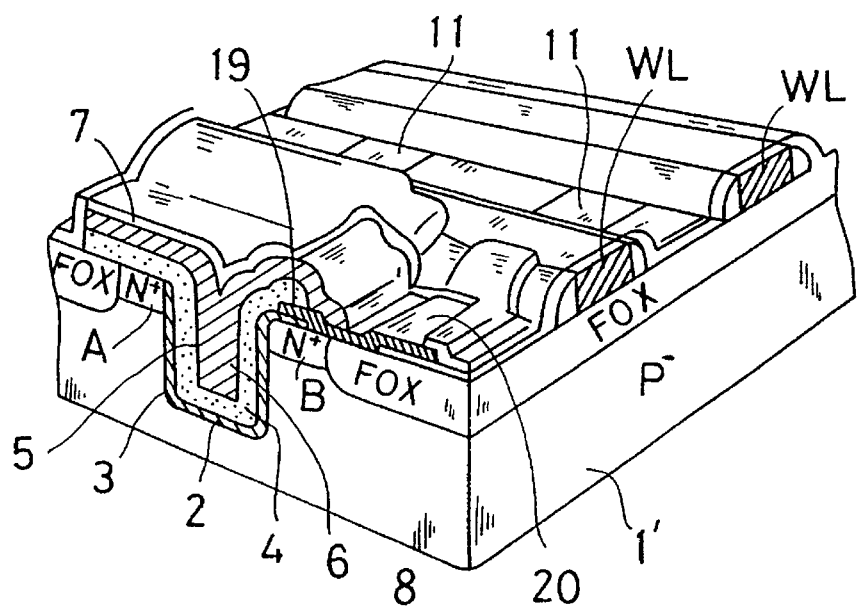
FIG. 17 is a perspective view showing the cell being produced and resulting from the step of FIG. 15.

Next, a surface protecting layer 7 of $SiO_2$ is formed over the entire surface by CVD, and the upper portion adjacent to the impurity region B is etched away to expose the second electrode layer 6. A contact hole 20 is formed in the portion of the exposed region to be connected to the contact strap 8 as seen in FIG. 17. An upper silicon electrode 9 is thereafter formed by deposition to fill up the contact hole as shown in FIG. 16, whereby a stack capacitor is constructed according to the invention. The first and second electrode layers and the upper electrode may be doped with an electrically conductive impurity element, such as P or As, when desired for giving improved conductivity.

After the stack capacitor cell has been thus formed, an interlayer insulating film, bit line, bit line contact, etc. are formed by conventional methods to afford a FEC-DRAM according to the invention as seen in FIG. 1.

Figure 18:
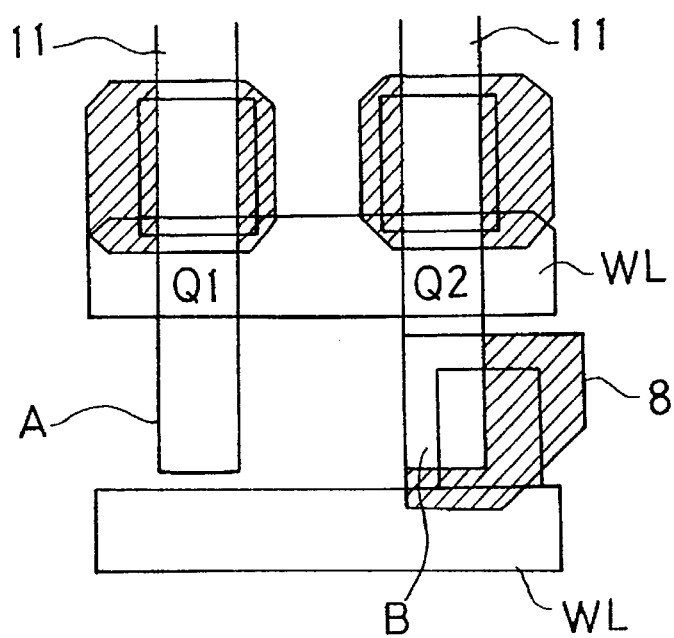
FIG. 18 to FIG. 21 are layout diagrams showing some steps of the process of the invention in sequence.
Figure 19:
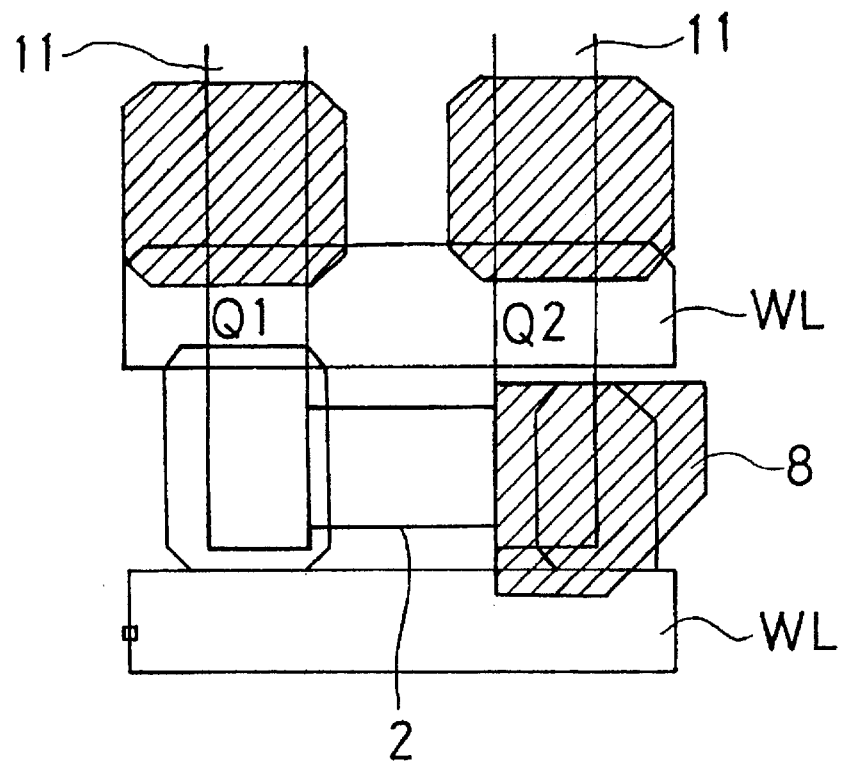
Figure 20:
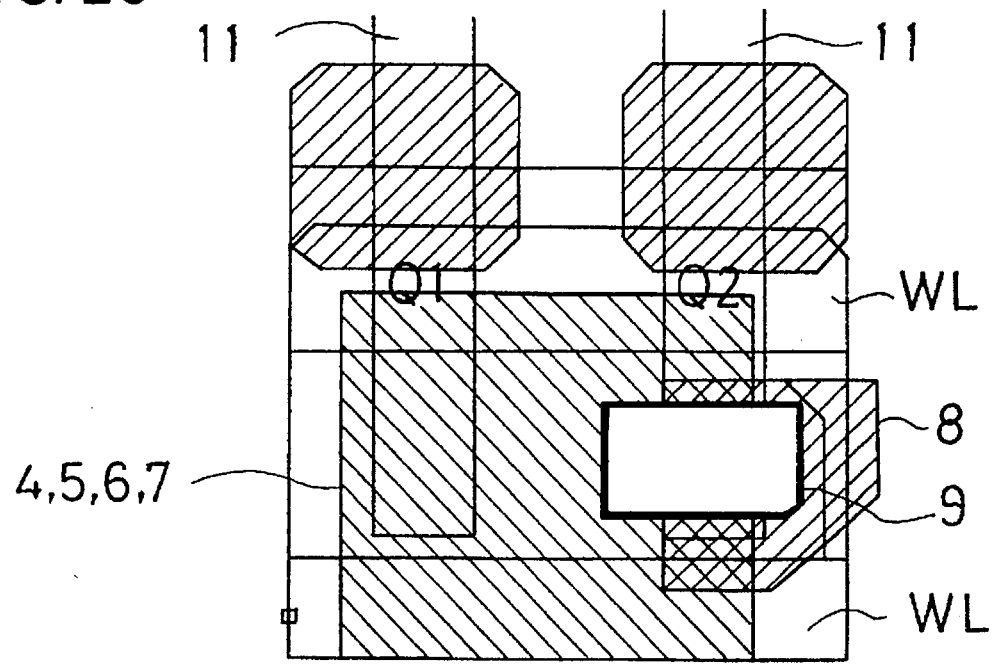
Figure 21:
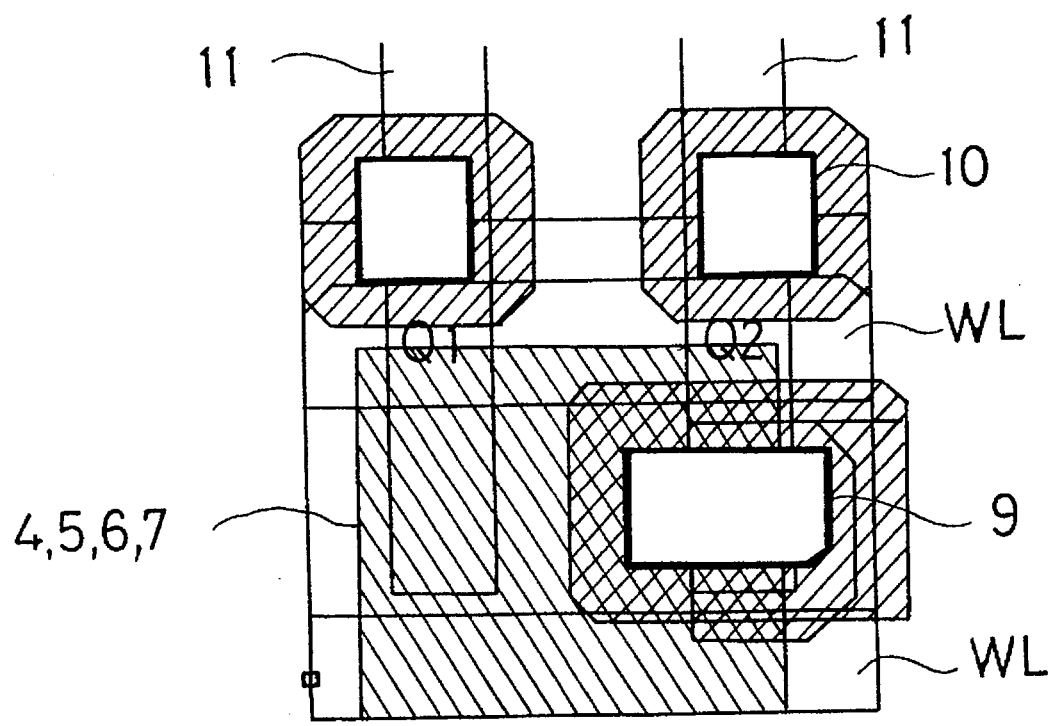
Figure 22:
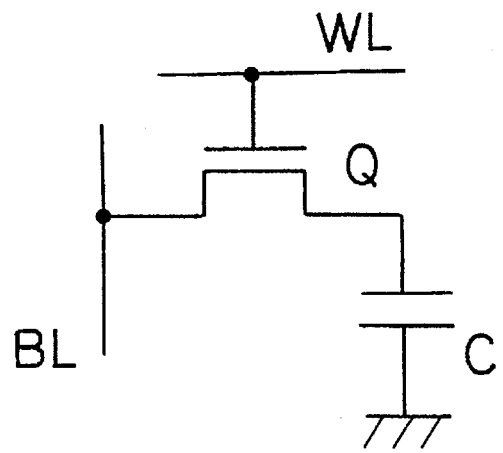
FIG. 22 is an equivalent circuit diagram of a DRAM cell of the 2 elements/bit type.

FIGS. 18 to 21 show the layout of the device stepwise during the above process. FIG. 18 shows the device when the contact strap 8 is formed, FIG. 19 shows the trench 2 formed, FIG. 20 shows the stack capacitor layer and the upper silicon electrode layer formed, and FIG. 21 shows the DRAM as completed.

With the FEC-DRAM of the present invention, the presence of the trench realizes a stack capacitor having a sufficient capacitance between the impurity regions A and B. Consequently, the DRAM of the 3 elements/ 2 bits type can be constructed within a smaller area than conventionally possible. This leads to a higher packing density. In fact, the cell utility factor CUF (capacitor area/cell area) achieved by the above example is as high as 50% in contrast with the conventional factor which is up to about 40%. This substantiates the improvement achieved by the invention in packing density.

As described above, the present invention readily provides FEC-DRAMs of the 3 elements/2 bits type which are reduced in the area occupied. The present invention is therefore very useful in the field of DRAMs which are expected to have a still higher packing density.

What we claim is:

1. A two-transistor, one-capacitor RAM comprising:
   (a) said two transistors being a pair of capacitively coupled MOS transistors formed side by side on a substrate, the first of said pair of MOS transistors having a source impurity region A embedded in an upper region of the substrate and the second of said pair having a drain impurity region B embedded in said upper region of the substrate, (b) a trench with an insulating layer lining formed in the substrate between impurity regions A and B adjacent to each other at one end of each of the MOS transistors, wherein said trench extends below said upper region of said substrate, and (c) a stack capacitor comprising a first electrode layer connected to and overlaying the impurity region A, a capacitor insulating layer and a second electrode layer connected to the impurity region B through the intermediary of a contact strap, said electrode layers being vertically superimposed, sandwiching said capacitor insulating layer, and embedded in said trench, and being insulated from the substrate by the insulating layer lining in the trench, wherein a first electrode portion of the first electrode layer overlays a portion of the contact strap over impurity region B with an insulating layer therebetween, and the second electrode layer overlays the first electrode portion with an insulating film therebetween.

2. A dynamic RAM as in claim 1 wherein the stack capacitor extends so as to partly cover a word line region serving as the gate of each of the MOS transistors.

3. A dynamic RAM as in claim 1 wherein said second electrode layer is superimposed over said first electrode layer within said trench and said insulating layer is between the electrode layers.

4. A dynamic RAM comprising:

a first MOS transistor on a substrate having a drain comprising impurity region A and a second MOS transistor on said substrate having a source comprising impurity region B, said impurity regions A and B being adjacent to one another;

a trench in said substrate separating said impurity regions A and B, and a stack capacitor capacitively coupling said drain and source of the MOS transistors, said capacitor comprising a first electrode layer conductively coupled to and overlaying said impurity region A, a capacitor insulating film and a floating electrode layer conductively coupled to said impurity region B through the intermediary of a contact strap, said electrode layers being vertically superimposed, sandwiching said capacitor insulating film, and embedded within said trench, and said capacitor insulating film separating said first and second electrodes, wherein a first electrode portion of the first electrode layer overlays a portion of the contact strap over impurity region B with an insulating layer therebetween, and the second electrode layer overlays the first electrode portion with an insulating film therebetween.

5. A dynamic random access memory cell for storing two data bits comprising:

a first MOS transistor on a substrate having a drain comprising impurity region A and a second MOS transistor on said substrate having a source comprising impurity region B, said impurity regions A and B being adjacent to one another;

a trench in said substrate separating said impurity regions A and B, and a floating electrode capacitor capacitively coupling said drain and source of the MOS transistors, said capacitor comprising a first electrode layer conductively coupled to said impurity region A, a capacitor insulating film and a floating electrode layer conductively coupled to said impurity region B through the intermediary of a contact strap, said electrode layers being vertically superimposed, sandwiching said capacitor insulating film and embedded within said trench, and said capacitor insulating film separating said first and second electrodes.

6. A dynamic RAM comprising:

(a) a pair of adjacent transistors, the first of said pair of transistors having a source impurity region A and the second of said pair having a drain impurity region B, (b) a trench with an insulating layer lining formed in the substrate between the pair of transistors and between impurity regions A and B, and (c) a stack capacitor in said trench comprising a first electrode layer operatively connected to and overlaying the impurity region A, a capacitor insulating layer and a second electrode layer operatively connected to the impurity region B, wherein said capacitor capacitively couples the pair of transistors, wherein a first electrode portion of the first electrode layer overlays a portion of the contact strap over impurity region B with an insulating layer therebetween, and the second electrode layer overlays the first electrode portion with an insulating film therebetween.

* * * * *